United States Patent
Kim et al.

(10) Patent No.: US 8,900,780 B2
(45) Date of Patent: Dec. 2, 2014

(54) PHOTOSENSITIVE RESIN COMPOSITION FOR COLOR FILTER AND COLOR FILTER USING THE SAME

(75) Inventors: Jae-Hyun Kim, Uiwang-si (KR);
Kyung-Soo Moon, Uiwang-si (KR);
Myoung-Youp Shin, Uiwang-si (KR);
Dong-Hoon Won, Uiwang-si (KR);
Seung-Hyun Kim, Uiwang-si (KR);
Atsushi Endo, Uiwang-si (KR);
Hwan-Sung Cheon, Uiwang-si (KR);
Gyu-Seok Han, Uiwang-si (KR)

(73) Assignee: Cheil Industries Inc., Gumi-shi (KR)

( * ) Notice: Subject to any disclaimer, the term of this patent is extended or adjusted under 35 U.S.C. 154(b) by 0 days.

(21) Appl. No.: 14/236,961

(22) PCT Filed: May 15, 2012

(86) PCT No.: PCT/KR2012/003780
§ 371 (c)(1),
(2), (4) Date: Feb. 4, 2014

(87) PCT Pub. No.: WO2013/100276
PCT Pub. Date: Jul. 4, 2013

(65) Prior Publication Data
US 2014/0234758 A1    Aug. 21, 2014

(30) Foreign Application Priority Data

Dec. 26, 2011   (KR) .................. 10-2011-0142407

(51) Int. Cl.
*G03F 7/004*    (2006.01)
*G02B 5/20*     (2006.01)

(52) U.S. Cl.
USPC ............ 430/7; 430/270.1; 540/467; 540/474

(58) Field of Classification Search
None
See application file for complete search history.

(56) References Cited

U.S. PATENT DOCUMENTS

| | | | |
|---|---|---|---|
| 5,219,709 A * | 6/1993 | Nagasaka et al. .......... | 430/281.1 |
| 5,625,062 A | 4/1997 | Mader et al. | |
| 5,681,685 A * | 10/1997 | Yamaoka et al. .......... | 430/281.1 |
| 6,033,813 A | 3/2000 | Endo et al. | |
| 7,605,438 B2 | 10/2009 | Uchida | |
| 8,084,533 B2 | 12/2011 | Lynch | |
| 8,569,854 B2 | 10/2013 | Uchida | |
| 2008/0179572 A1 | 7/2008 | Kim et al. | |

FOREIGN PATENT DOCUMENTS

| | | | |
|---|---|---|---|
| CN | 101183680 A | | 5/2008 |
| EP | 2105792 A1 | | 9/2009 |
| JP | 02-259768 A | | 10/1990 |
| JP | 06-041458 A | | 2/1994 |
| JP | 07-140654 A | | 6/1995 |
| JP | 10-254133 A | | 9/1998 |
| JP | 2008-145480 A | | 6/2008 |
| JP | 2009-040860 A | * | 2/2009 |
| JP | 2009-242469 A | | 10/2009 |
| JP | 2011-215537 A | | 10/2011 |
| KR | 10-1999-0007097 A | | 1/1999 |
| KR | 10-2002-0015650 A | | 2/2002 |
| KR | 10-2005-0020653 A | | 3/2005 |
| KR | 10-2009-0035468 A | | 4/2009 |
| KR | 10-2009-0073932 A | | 7/2009 |
| KR | 10-2009-0106226 A | | 10/2009 |
| KR | 10-2010-0078845 A | | 7/2010 |
| KR | 10-2010-0080142 A | | 7/2010 |
| KR | 10-2011-0079198 A | | 7/2011 |
| TW | 2008-44493 A | | 11/2008 |
| WO | 2005/105885 A1 | | 11/2005 |
| WO | 2013/100276 A1 | | 7/2013 |

OTHER PUBLICATIONS

Computer-generated translation of JP 2009-040860 (Feb. 2009).*
International Search Report and Written Opinion in counterpart International Application No. PCT/KR2012/003780 dated Nov. 30, 2012, pp. 1-7.
Search Report in counterpart Taiwanese Application No. 101118533 dated Apr. 18, 2014, pp. 1.

* cited by examiner

*Primary Examiner* — John A. McPherson
(74) *Attorney, Agent, or Firm* — Additon, Higgins & Pendleton, P.A.

(57) ABSTRACT

Disclosed are a photosensitive resin composition for a color filter and a color filter using the same. The photosensitive resin composition for a color filter includes (A) a dye represented by the following Chemical Formula 1, (B) an alkali soluble resin, (C) a photopolymerizable monomer, (D) a photopolymerization initiator, and (E) a solvent.

9 Claims, No Drawings

PHOTOSENSITIVE RESIN COMPOSITION FOR COLOR FILTER AND COLOR FILTER USING THE SAME

CROSS-REFERENCE TO RELATED APPLICATIONS

This application claims priority to and the benefit of International Application No. PCT/KR2012/003780, filed May 15, 2012, which published as WO 2013/100276 on Jul. 4, 2013, and Korean Patent Application No. 10-2011-0142407, filed in the Korean Intellectual Property Office on Dec. 26, 2011, the entire disclosure of each of which is incorporated herein by reference.

TECHNICAL FIELD

This disclosure relates to a photosensitive resin composition for a color filter and a color filter using the same.

BACKGROUND ART

A liquid crystal display device is one of display devices and has advantages of lightness, thinness, low cost, low power consumption, an excellent junction with an integrated circuit, and the like, and thus is widely applied for a laptop, a monitor, and a TV screen. The liquid crystal display device includes a lower substrate including a black matrix, a color filter, and an indium tin oxide (ITO) pixel electrode, and an upper substrate including an active circuit portion including a liquid crystal layer, a thin film transistor, an electricity storage capacitor layer, and an ITO pixel electrode. In the liquid crystal display device, color filters are formed in a pixel region by sequentially laminating a plurality of color filters (in general, formed of three primary colors such as red (R), green (G), and blue (B)) in a predetermined order to form each pixel, and a black matrix layer is disposed in a predetermined pattern on a transparent substrate to form a boundary between the pixels.

A color filter may be fabricated in a pigment dispersion method. According to the pigment dispersion method, a thin film is formed by repeatedly coating a photosensitive resin composition including an alkali soluble resin, a photopolymerization monomer, a photopolymerization initiator, an epoxy resin, a solvent, and other additives as well as a colorant on a transparent substrate provided with a black matrix, exposing a desired pattern to a light, removing an unexposed part with a solvent, and thermally curing the resulting product. Accordingly, this method is actively applied to fabricate an LCD for a mobile phone, a laptop, a monitor, a TV, and the like. However, a photosensitive resin composition for a color filter for the pigment dispersion method has recently required high luminance, a high contrast ratio, and the like as well as high color reproducibility and excellent pattern profiles.

An image sensor is a part for photographing images in a portable phone camera or a DSC (digital still camera). It can be classified as a charge-coupled device (CCD) image sensor and a complementary metal oxide semiconductor (CMOS) image sensor depending upon the manufacturing process and the application method. A color imaging device for a charge-coupled device (CCD) image sensor or a complementary metal oxide semiconductor (CMOS) image sensor includes color filters each having filter segments of mixing primary color of red, green, and blue, and the colors are separated. A recent color filter mounted in the color imaging device has a pattern size of 2 μm or less, which is 1/100th to 1/200th of the pattern size of a conventional color filter pattern for LCDs. Accordingly, increased resolution and decreased pattern residues are important factors for determining the performance of a device.

A color filter fabricated by using a conventional pigment-type photosensitive resin composition has a limit in luminance and a contrast ratio due to the size of pigment particles. In addition, a color imaging device for an image sensor needs a smaller dispersion particle diameter for forming a fine pattern. Accordingly, an attempt to fabricating a color filter having improved luminance and a contrast ratio by using a dye with no particle instead of a pigment to prepare a color filter having improved luminance and a contrast ratio has been made (Patent Laid-Open Nos. 1999-0007097, 2002-0015650, and 2005-0020653).

DISCLOSURE

Technical Problem

A squarium-based compound is known to have excellent green spectrum characteristics and high molar absorption coefficients. Therefore, one embodiment provides a color filter having high luminance and high contrast ratio performance in a desired color coordinates and simultaneously, appropriate spectrum characteristics under a color coordinate condition according to sRGB (standard Red Green Blue), NTSC (national television system committee), and EBU (europien broadcasting union) standards by using a dye including the squarium-based compound.

One embodiment provides a photosensitive resin composition realizing a color filter having improved luminance and a contrast ratio.

Another embodiment provides a color filter using the photosensitive resin composition.

Technical Solution

According to one embodiment, provided is a photosensitive resin composition for a color filter that includes (A) a dye represented by the following Chemical Formula 1, (B) an alkali soluble resin, (C) photopolymerizable monomer, (D) a photopolymerization initiator, and (E) a solvent.

[Chemical Formula 1]

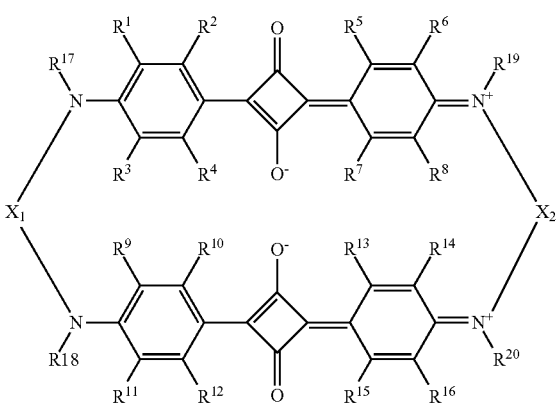

In Chemical Formula 1, $R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, $X_1$ and $X_2$ are each independently a linking group selected from —O—, —NH—, —S—, a substituted or unsubstituted C1 to C30 alkylene group, a substituted or unsubstituted C6 to C30 arylene group, a substituted or unsubstituted C3 to C30 heteroarylene group, and a combination thereof.

The dye (A) may be represented by the following Chemical Formula 2.

In Chemical Formula 2, $R^{21}$ to $R^{28}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, $R^{29}$ to $R^{32}$ are each independently, hydrogen, a substituted or unsubstituted C1 to C30 alkyl group, a substituted or unsubstituted C6 to C30 aryl group, or a substituted or unsubstituted C3 to C30 heteroaryl group, and $X_3$ and $X_4$ are a linking group represented by the following Chemical Formula 3, and are the same or different from each other,

[Chemical Formula 2]

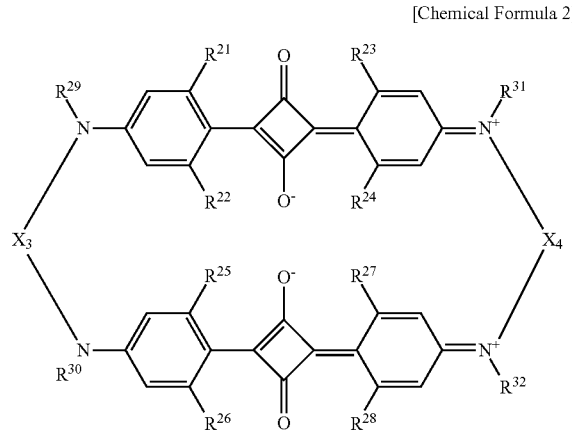

[Chemical Formula 3]

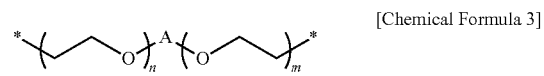

In Chemical Formula 3, n and m are an integer ranging from 0 to 5, and

A is a substituted or unsubstituted C1 to C30 alkylene group, a substituted or unsubstituted C6 to C30 arylene group, or a combination thereof.

The dye (A) may include at least one compounds represented by the following Chemical Formulae 4 to 9.

[Chemical Formula 4]

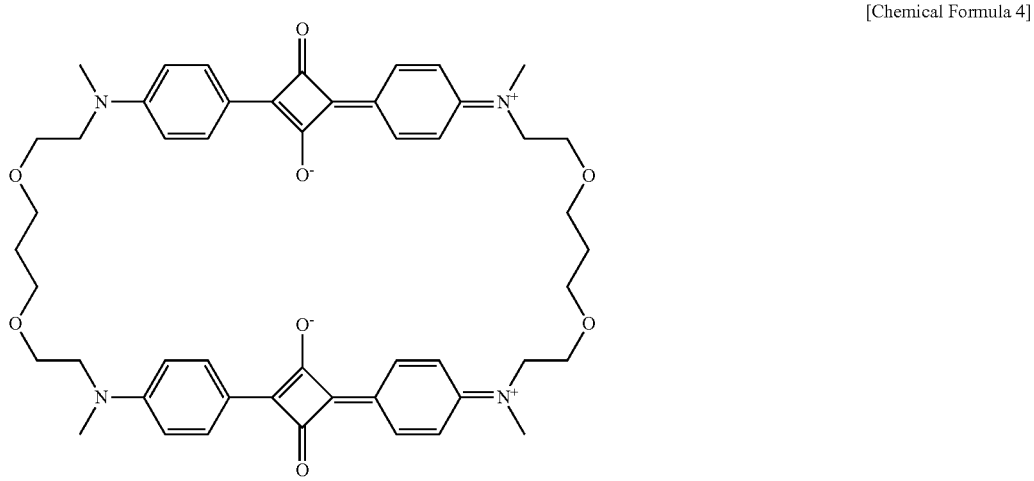

[Chemical Formula 5]
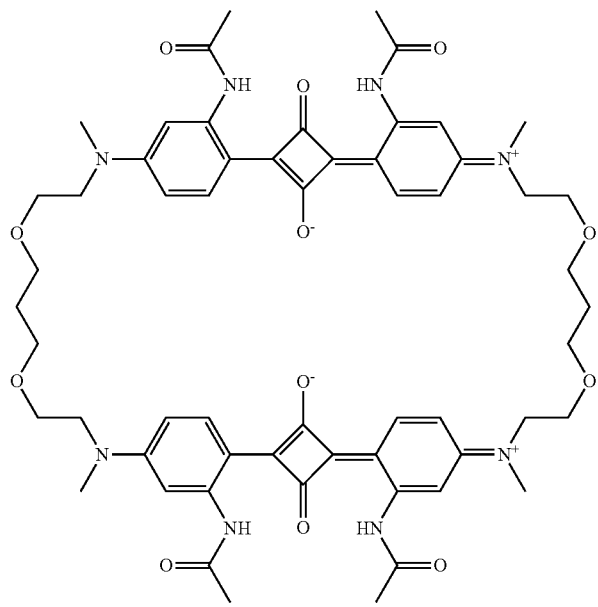
[Chemical Formula 6]
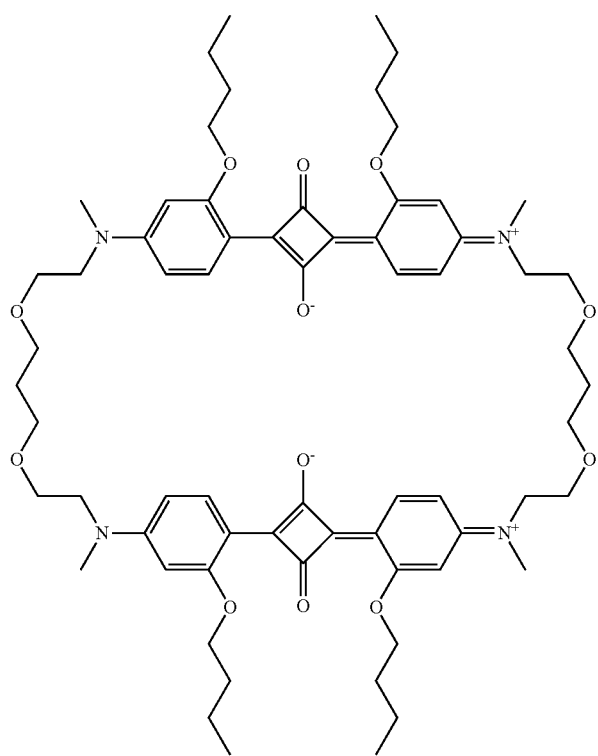

-continued
[Chemical Formula 7]
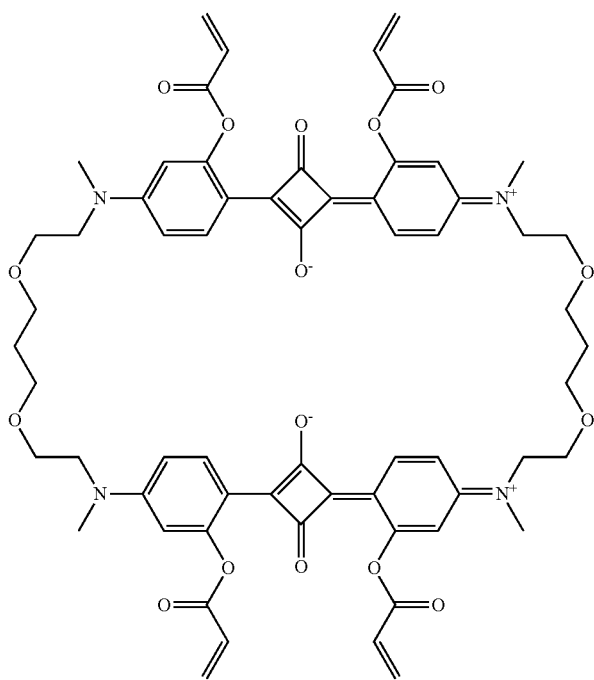
[Chemical Formula 8]
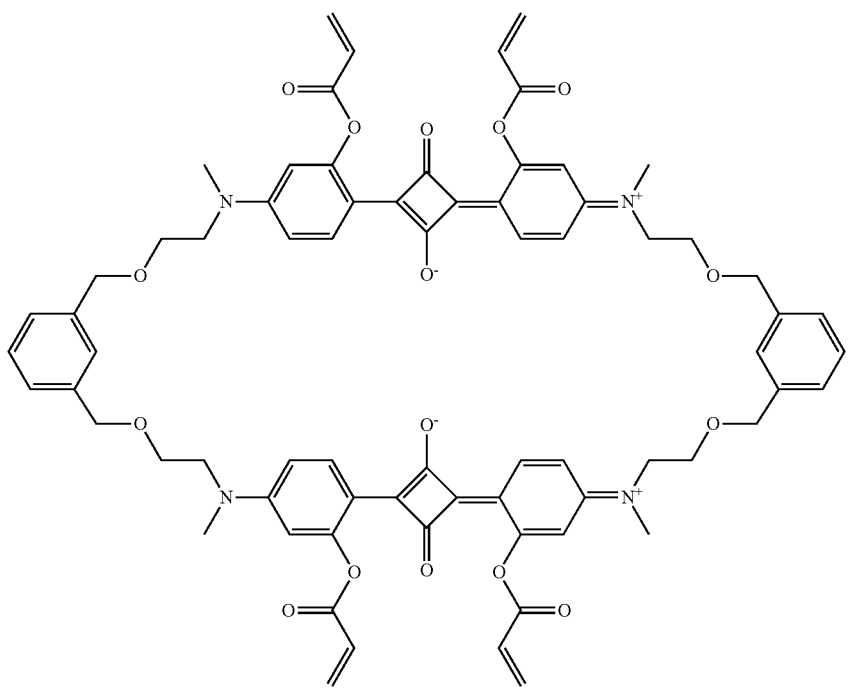

[Chemical Formula 9]

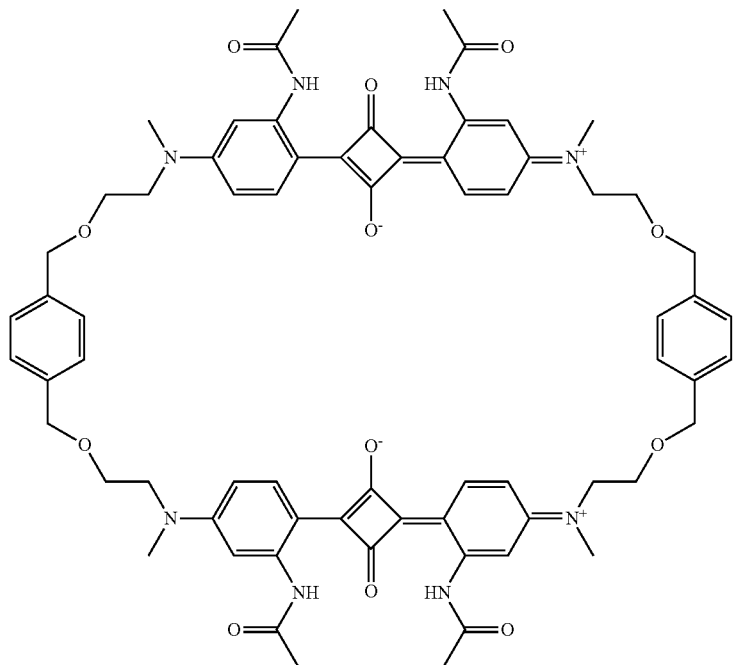

The dye (A) may have a molecular weight of 500 to 5,000.

The photosensitive resin composition for a color filter may include 0.1 to 20 wt % of the dye (A).

The photosensitive resin composition for a color filter may further include a pigment.

The photosensitive resin composition for a color filter may include the dye (A) and pigment at a weight ratio of 99:1 to 1:99.

Another embodiment provides a color filter manufactured using the photosensitive resin composition for a color filter.

Another embodiment provides a dye represented by the following Chemical Formula 1.

[Chemical Formula 1]

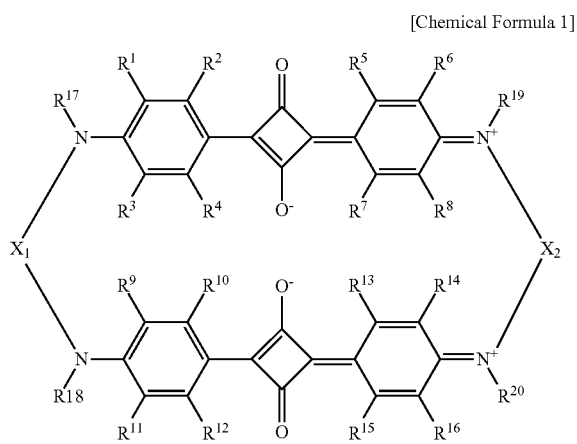

In Chemical Formula 1, $R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, and $X_1$ and $X_2$ are each independently a linking group selected from —O—, —NH—, —S—, substituted or unsubstituted C1 to C30 alkylene group, a substituted or unsubstituted C6 to C30 arylene group, a substituted or unsubstituted C3 to C30 heteroarylene group, and a combination thereof.

Advantageous Effects

The photosensitive resin composition for a color filter may realize a color filter having improved luminance and a contrast ratio.

BEST MODE

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when specific definition is not provided, the term "substituted" refers to one substituted with at least a substituent selected from the group consisting of a halogen, an alkyl group, a cycloalkyl group, an aryl group, an alkoxy group, an amino group, and an alkenyl group, instead of at least one hydrogen of a compound.

As used herein, when specific definition is not provided, the term "alkyl group" may refer to a C1 to C30 alkyl group, for example a C1 to C15 alkyl group, the term "cycloalkyl group" may refer to a C3 to C30 cycloalkyl group, for example a C3 to C18 cycloalkyl group, the term "alkoxy group" may refer to a C1 to C30 alkoxy group, for example a C1 to C18 alkoxy group, the term "aryl group" may refer to a C6 to C30 aryl group, for example a C6 to C18 aryl group, the term "aryloxy group" may refer to a C6 to C30 aryloxy group, for example a C6 to C18 aryloxy group, the term "heteroaryl group" may refer to a C3 to C30 heteroaryl group, for example a C3 to C18 heteroaryl group, the term "heteroaryloxy group" may refer to a C3 to C30 heteroaryloxy group, for example a C3 to C18 heteroaryloxy group, the term "alkenyl group" may refer to a C2 to C30 alkenyl group, for example a C2 to C18 alkenyl group, the term "alkenylene group" may refer to a C2 to C30 alkenylene group, for example a C2 to C18 alkenylene group, the term "arylene group" may refer to a C6 to C30 arylene group, for example a C6 to C18 arylene group, and the term "heteroarylene group" may refer to a C3 to C30 heteroarylene group, for example a C3 to C18 heteroarylene group.

As used herein, when a definition is not otherwise provided, the term "combination thereof" may refer at least two substituents linked to each other through a single bond and or a linking group, or at least two substituents condensed to each other.

As used herein, "*" denotes a position linked to the same or different atom or chemical formula.

One embodiment provides a dye represented by the following Chemical Formula the following Chemical Formula 1.

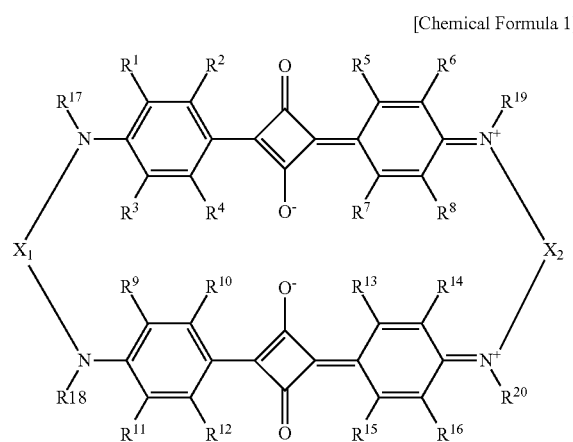

[Chemical Formula 1]

In Chemical Formula 1, $R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, and $X_1$ and $X_2$ are each independently a linking group selected from —O—, —NH—, —S—, a substituted or unsubstituted C1 to C30 alkylene group, a substituted or unsubstituted C6 to C30 arylene group, a substituted or unsubstituted C3 to C30 heteroarylene group, and a combination thereof.

Another embodiment provides a photosensitive resin composition for a color filter that includes (A) the dye represented by the above Chemical Formula 1, (B) an alkali soluble resin, (C) a photopolymerizable monomer, (D) a photopolymerization initiator, and (E) a solvent.

Accordingly, the present invention may provide a color filter having improved luminance and a contrast ratio by using the dye having green spectrum characteristics and a high molar absorption coefficient, instead of a pigment to solve a conventional problem of deteriorating a contrast ratio and suppressing photo transmittance of a green region and thus, deteriorating luminance due to pigment particle sizes.

Hereinafter, each component of the photosensitive resin composition according to one embodiment is described in detail. However, these embodiments are only exemplary, and the present invention is not limited thereto.

(A) Dye

One embodiment provides a dye represented by the following Chemical Formula 1.

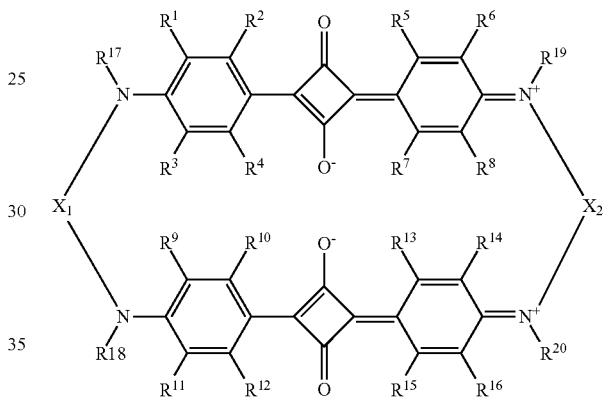

[Chemical Formula 1]

In Chemical Formula 1, $R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, and $X_1$ and $X_2$ are each independently a linking group selected from —O—, —NH—, —S—, a substituted or unsubstituted C1 to C30 alkylene group, a substituted or unsubstituted C6 to C30 arylene group, a substituted or unsubstituted C3 to C30 heteroarylene group, and a combination thereof.

Since a squarium-based green dye has a structure linked by X1 and X2 linking groups in the above Chemical Formula 1 and a high molecular weight, a color filter fabricated using the dye may secure excellent durability and chemical resistance.

In addition, since the dye has a smaller dispersion particle diameter than a pigment, and a functional group, a substituent, and O− and N+ in the above Chemical Formula 1 have polarity, the dye may have high solubility in an organic solvent. In this way, a photosensitive composition for a color filter according to one embodiment includes a dye having high dispersiblity and thus, may form excellent fine pattern, improving the luminance and contrast ratio of a color filter.

In one embodiment, the dye may be a compound represented by the following Chemical Formula 2.

[Chemical Formula 2]

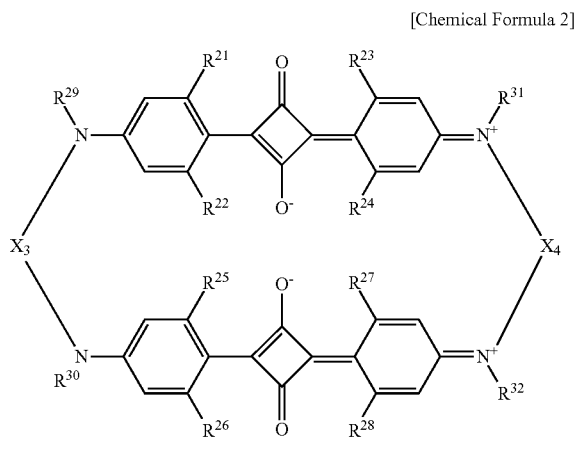

In Chemical Formula 2, $R^{21}$ to $R^{28}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, for example hydrogen, —OCH2CH2CH3, —OCH2CH2CH2CH3, —N(H)C(=O)CH3, a methacrylate group, an acrylate group, and the like.

$R^{29}$ to $R^{32}$ are each independently, hydrogen, a substituted or unsubstituted C1 to C30 alkyl group, a substituted or unsubstituted C6 to C30 aryl group, or a substituted or unsubstituted C3 to C30 heteroaryl group, for example a methyl group, an ethyl group, a 1-hydroxyethyl group, a propyl group, an isopropyl group, a butyl group, an isobutyl group, a t-butyl group, a pentyl group, a hexyl group, a phenyl group, and the like.

$X_3$ and $X_4$ may be a linking group represented the following Chemical Formula 3, and may be the same or different.

[Chemical Formula 3]

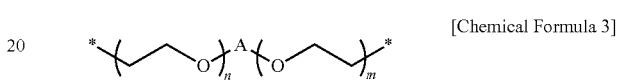

In Chemical Formula 3, n and m are an integer ranging from 0 to 5, A is a substituted or unsubstituted C1 to C30 alkylene group, a substituted or unsubstituted C6 to C30 arylene group, or a combination thereof, and in one embodiment the substituted or unsubstituted C1 to C30 alkylene group may be a methylene group, an ethylene group, a propylene group, a 2-hydroxypropylene group, a butylene group, a pentylene group, and the substituted or unsubstituted C6 to C30 arylene group may be a phenylene group, a naphthalene group, an anthracene group, a phenanthrene group, and the like.

In one embodiment, the dye may be one of the compounds represented by the following Chemical Formulae 4 to 9.

[Chemical Formula 4]

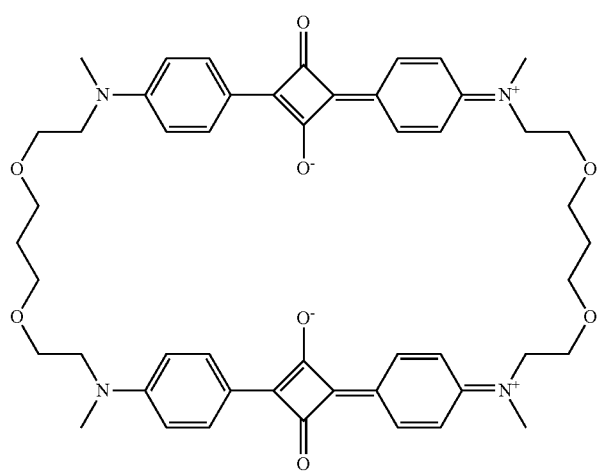

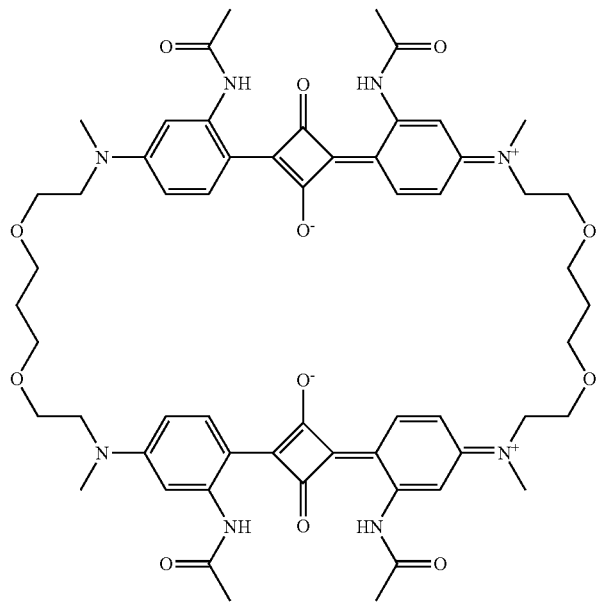
[Chemical Formula 5]
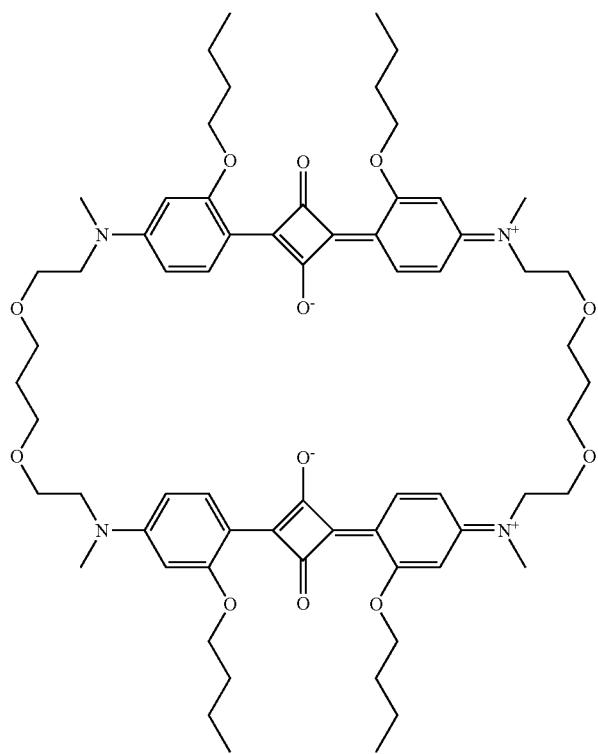
[Chemical Formula 6]

-continued
[Chemical Formula 7]
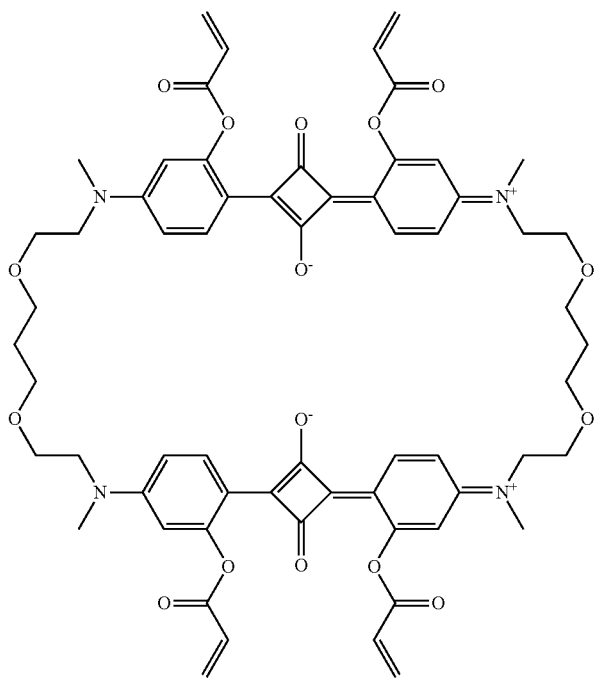
[Chemical Formula 8]
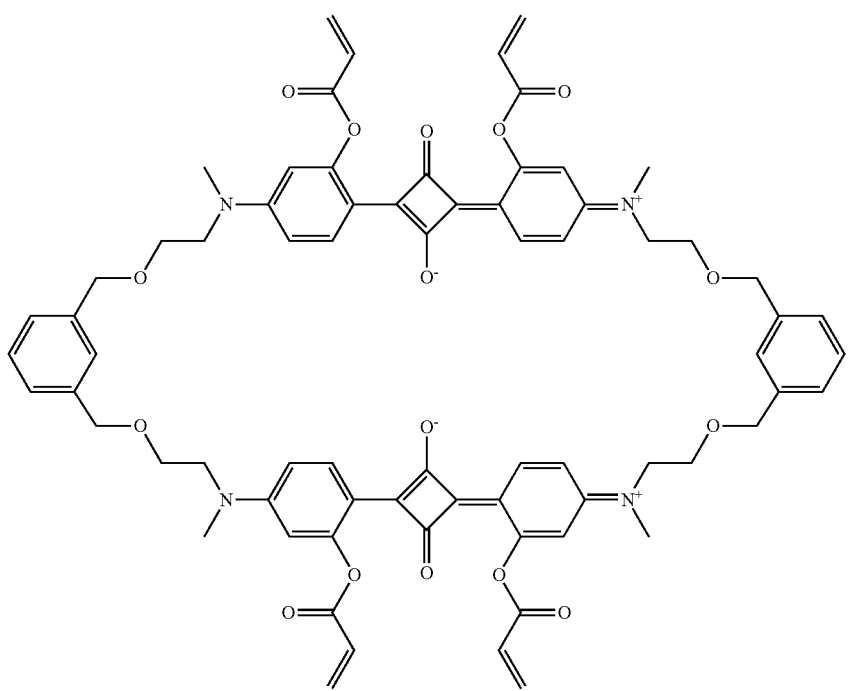

[Chemical Formula 9]

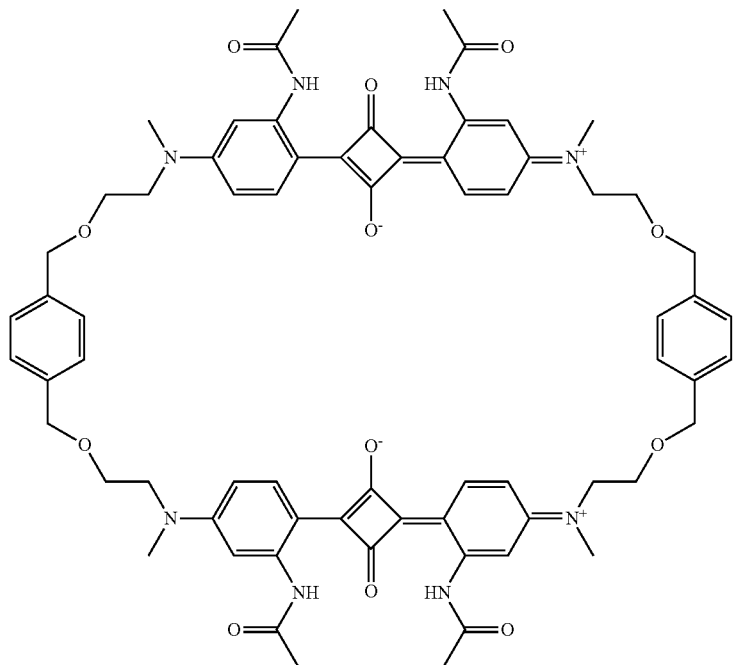

The dye may have solubility of 0.01 to 20 wt %, and specifically, 0.1 to 10 wt % with respect to a solvent. Since the dye has high solubility in a solvent, it may accomplish high luminance, a high contrast ratio, and the like as well as excellent pattern characteristics of a color filter.

The dye may have a molecular weight of 500 to 5,000, for example 700 to 2,000. When the dye has a molecular weight within the range, a photosensitive resin composition may have high dispersiblity, durability, and solubility. When the dye has a molecular weight of less than 500, a photosensitive resin composition may have deteriorated durability such as heat resistance, light resistance and chemical resistance, while the dye has a molecular weight of more than 5000, the dye may have deteriorated solubility.

The dye may be included in an amount of 0.1 to 20 wt % in the photosensitive filter composition for a color filter. When the dye is included within the range, it may form a pattern color having excellent reproducibility and color distinction and excellent light and heat resistances.

(B) Alkali Soluble Resin

The alkali soluble resin is a carboxyl group-containing acryl-based binder resin, and a copolymer of a first ethylenic unsaturated monomer having at least one carboxyl group and a second ethylenic unsaturated monomer copolymerizable with the first ethylenic unsaturated monomer.

The first ethylenic unsaturated monomer may be acrylic acid, methacrylic acid, maleic acid, itaconic acid, fumaric acid, and the like, and the alkali soluble resin may include at least one forgoing monomer.

The first ethylenic unsaturated monomer may be included in an amount of 10 to 40 wt %, for example 20 to 30 wt % based on the total weight of the alkali soluble resin. When the first ethylenic unsaturated monomer is included within the range, an acryl-based binder resin has an appropriate acid value and thus, may improve developability for an alkali developing solution and stabilize a dye dispersion solution.

The second ethylenic unsaturated monomer copolymerizable with the first ethylenic unsaturated monomer includes, but is not limited to, an unsaturated carbonic acid ester compound, an unsaturated carbonic acid amino alkyl ester compound, an carbonic acid vinyl ester compound, an unsaturated carbonic acid glycidyl ester compound, a vinyl cyanide compound, or an unsaturated amide compound.

Examples of the unsaturated carbonic acid ester compound may include styrene, α-methyl styrene, vinyltoluene, vinyl benzylmethyl ether, methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclo hexyl acrylate, cyclo hexyl methacrylate, phenyl acrylate, phenyl methacrylate, and the like; examples of the unsaturated carbonic acid amino alkyl ester compound may include 2-amino ethyl acrylate, 2-aminoethyl methacrylate, 2-dimethyl amino ethyl acrylate, 2-dimethyl amino ethyl methacrylate, and the like; examples of the carbonic acid vinyl ester compound may include vinyl acetate, vinyl benzoate, and the like; examples of the unsaturated carbonic acid glycidyl ester compound may include glycidyl acrylate, glycidyl methacrylate, and the like; examples of the vinyl cyanide compound may include acrylo nitrile, methacrylo nitrile, and the like; and examples of the unsaturated amide compound may include acryl amide, methacryl amide, and the like, but they are not limited thereto. The alkali soluble resin may include at least one of the foregoing second ethylenic unsaturated monomers.

Examples of the alkali soluble resin may include a methacrylic acid/methyl methacrylate copolymer, a methacrylic acid/benzyl methacrylate copolymer, a methacrylic acid/benzyl metacrylate/styrene copolymer, a methacrylic acid/benzyl methacrylate/2-hydroxy ethyl methacrylate copolymer, a methacrylic acid/benzyl methacrylate/styrene/2-hydroxy ethyl methacrylate copolymer, and the like. They may be used singularly or as a mixture of two or more.

The alkali soluble resin may have a weight average molecular weight (Mw) of 10,000 to 70,000, and specifically 20,000 to 50,000. Within the above range, high resolution pixels may be obtained.

The alkali soluble resin may have an acid value of 10 to 120 KOH mg/g, and specifically 90 to 120 KOH mg/g. Within the above range, strength of pattern regions may be sufficiently realized, and developability of non-exposed parts by an alkali developing solution is excellent.

The alkali soluble resin may be included in an amount of 0.5 wt % to 30 wt % based on the total weight of the photosensitive resin composition. Within the above range, developability by an alkali developing solution is good, and excellent cross-linking is realized to provide a pixel layer having low surface roughness.

(C) Photopolymerizable Monomer

The photopolymerizable monomer may be generally-used acryl-based photopolymerizable monomers in a photosensitive resin composition for a color filter. Examples of the photopolymerizable monomer may include ethyleneglycoldiacrylate, triethyleneglycoldiacrylate, 1,4-butanedioldiacrylate, 1,6-hexanediol diacrylate, neopentylglycoldiacrylate, pentaerythritoldiacrylate, pentaerythritol triacrylate, dipentaerythritoldiacrylate, dipentaerythritoltriacrylate, dipentaerythritolpenta acrylate, dipentaerythritolhexaacrylate, pentaerythritol hexaacrylate, bisphenol A diacrylate, trimethylolpropanetriacrylate, novolacepoxyacrylate, ethyleneglycoldimethacrylate, diethyleneglycol dimethacrylate, triethyleneglycoldimethacrylate, propyleneglycol dimethacrylate, 1,4-butanedioldimethacrylate, 1,6-hexanedioldimethacrylate, and the like. They may be used singularly or as a mixture of two or more.

The photopolymerizable monomer may be included in an amount ranging from 0.5 wt % to 30 wt % based on the total weight of the photosensitive resin composition. Within the above range, excellent developability with respect to an alkali developing solution is realized.

(D) Photopolymerization Initiator

The photopolymerization initiator may be generally-used photopolymerization initiators in a photosensitive resin composition. Examples of the photopolymerization initiator may include an acetophenone-based compound, a benzophenone-based compound, thioxanthone-based compound, a benzoin-based compound, or a triazine-based compound.

The acetophenone-based compound may include 2,2'-diethoxyacetophenone, 2,2'-dibutoxyacetophenone, 2-hydroxy-2-methylpropiophenone, p-t-butyltrichloroacetophenone, p-t-butylchloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like.

The benzophenone-based compound may include benzophenone, benzoyl benzoate, benzoyl methyl benzoate, 4,4'-dimethylaminobenzophenone, 4,4'-dichlorobenzophenone, 3,3'-dimethyl-2-methoxybenzophenone, 4-phenyl benzophenone, hydroxy benzophenone, acrylated benzophenone, 4,4'-bis(dimethyl amino)benzophenone, 4,4'-bis(diethyl amino)benzophenone, and the like.

The thioxanthone-based compound may include thioxanthone, 2-methylthioxanthone, isopropyl thioxanthone, 2,4-diethyl thioxanthone, 2,4-diisopropyl thioxanthone, 2-chloro thioxanthone, and the like.

The benzoin-based compound may include benzoin, benzoin methyl ether, benzoin ethyl ether, benzoin isopropyl ether, benzoin isobutyl ether, benzyldimethylketal, and the like.

The triazine-based compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine 2-biphenyl-4,6-bis(trichloro methyl)-s-triazine, bis(trichloromethyl)-6-styryl-s-triazine, 2-(naphtho 1-yl)-4,6-bis (trichloro methyl)-s-triazine, 2-(4-methoxy naphtho 1-yl)-4,6-bis(trichloro methyl)-s-triazine, 2,4-trichloro methyl (piperonyl)-6-triazine, 2,4-trichloro methyl(4'-methoxy styryl)-6-triazine, and the like.

The photopolymerization initiator may include a carbazole-based compound, a diketone-based compound, a sulfonium borate-based compound, a diazo-based compound, a nonimidazole-based compound, and the like, other than the aforementioned photopolymerization initiators.

(E) Solvent

The solvent may include, for example alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like; 2-alkoxy-2-methyl alkyl propionates of monooxy monocarboxylic acid alkyl esters such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanote, and the like; ketone acid esters such as ethyl pyruvate, and the like; a solvent having a high boiling point such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like.

In one embodiment, considering compatibility and reactivity, glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; propylene glycol alkylether acetates such as propylene glycol methylether acetate, propylene glycol propylether acetate, and the like may be preferable. Considering solubility of a dye, cyclohexanone may be used in an amount of 10 to 80 parts by weight based on 100 parts by weight of a solvent. These solvents may be used singularly or as a mixture of two or more.

The solvent is used as a balance, and specifically 20 wt % to 90 wt %. When the solvent is present within the range, the photosensitive resin composition has good coating property, and flatness at a thickness of greater than or equal to 1 μm may be maintained.

(F) Other Colorant

The photosensitive resin composition may include the dye (A) of the compound represented by Chemical Formula 1 as a single or a mixture of one or more, and may further include other dyes dye, pigments, or a combination thereof in order to realize color characteristics along with the dye (A). In particular, a hybrid type including both of a pigment and a dye may improve a problem of deterioration of light control sensitivity, pattern-breaking, pattern linearity, residue, and the like generated due to excessive use of a pigment.

The pigment may have a color such as red, green, blue, yellow, violet, and the like. The pigment may include a condensed polycyclic pigment such as an anthraquinone-based pigment, a perylene-based pigment, and the like, a phthalocyanine-based pigment, an azo-based pigment, and the like. They are used singularly or in a combination of two or more. Two or more pigments may be combined for adjusting maximum absorption wavelength, cross point, crosstalk, and the like.

The pigment may be dispersed in a solvent to be prepared in form of pigment dispersion and be included in the photosensitive resin composition for a color filter.

In order to disperse the pigment in the pigment dispersion uniformly, a dispersing agent may be used as needed. For this purpose, a non-ionic, anionic, or cationic dispersing agent may be used, for example polyalkyleneglycol and esters thereof, polyoxyalkylene, a polyhydric alcohol ester alkylene oxide addition product, an alcoholalkyleneoxide addition product, sulfonic acid ester, sulfonates, carboxylic acid ester, carboxylates, an alkylamidealkyleneoxide addition product, an alkylamine, and the like. These dispersing agents may be used singularly or as a mixture of two or more.

Along with the dispersing agent, a carboxyl group-containing first acryl-based resin may be added to the pigment dispersion to improve stability 을 improve and improve pattern formation of pixels.

The other dyes may include an anthraquinone-based compound, a cyanine-based compound, a mesocyanine-based compound, an azaporphyrin-based compound, a phthalocyanine-based compound, a pyrrolopyrrole-based compound, a diazo-based compound, a carbonium-based compound, an acridine-based compound, a thiazole-based compound, a quinomine-based compound, a mehine-based compound, a quinoline-based compound, and the like.

When the dispersion including the pigment and dye is used, the pigment and dye may be used in an amount of 99:1 to 1:99. Within the above range, high luminance and contrast ratio and desirable color characteristics may be realized.

The colorant including the dye and/or pigment may be included in an amount of 0.1 to 40 wt % based on the total amount of the photosensitive resin composition for a color filter. Within the above range, coloring effects and development performance may be desirable.

(G) Other Additive

The photosensitive resin composition according to one embodiment may further include other additives such as surfactants in order to prevent a stain or a spot during the coating, leveling adjustment, and generation of a residue due to non-development, along with the (A) to (F) components.

The surfactant may include BM-1000, BM-1100, and the like (BM Chemie Inc.); MEGAFACE F142D, MEGAFACE F172, MEGAFACE F173, MEGAFACE F183, and the like (DAINIPPON INK KAGAKU KOGYO CO., LTD.); FULORAD FC-135, FULORAD FC-170C, FULORAD FC-430, FULORAD FC-431, and the like (SUMITOMO 3M CO., LTD.); SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, SURFLON SC-106, and the like (ASAHI GLASS CO., LTD.); EFTOP EF301, EFTOP EF303, EFTOP EF352, and the like (TOCHEM PRODUCTS, CO., LTD.); SH-28PA, SH-190, SH-193, SZ-6032, SF-8428, and the like (TORAY SILICONE CO., LTD.).

The photosensitive resin composition may further other additives such as an adhesive aid, a preservation stabilizer, a heat resistance improvement agent, and the like within the purpose of the present invention, as needed.

According to another embodiment, a color filter including a pixel layer manufactured using the photosensitive resin composition is provided.

The color filter may be manufactured by coating the photosensitive resin composition on a wafer as a substrate using a using a method such as spin coating, slit coating, and the like to form a photosensitive resin composition layer having a thickness of 0.5 to 1 μm, radiating light to the coated photosensitive resin composition layer to form a pattern required for a color filter, treating the photosensitive resin composition layer with an alkali developing solution to dissolve the unradiated part and form a pattern for a color filter.

The substrate may be a silicon oxide (SiO2) or silicon nitride (SiNx), and during the radiating process, 365 nm I-line may be used as a light source. These processes are repeated as many times as the numbers of necessary R, G, and B colors to form a color filter with a desired pattern.

In addition, this image pattern may be cured by heating or radiating an active ray to further improve crack resistance, solvent resistance, and the like.

The color filter manufactured using the photosensitive resin composition according to one embodiment may realize a high resolution when it is applied to an image sensor.

MODE FOR INVENTION

The following examples illustrate the present invention in more detail. However, it is understood that the present invention is not limited by these examples.

Synthesis Examples

Synthesis Example 1

Synthesis of Dye Represented by Chemical Formula 4

Step 1: Synthesis of 2,4-bis(4-((2-hydroxyethyl)(methyl)amino)phenyl)cyclobuta-1,3-dien-1,3-diol 398 mg of squaric acid and 1.81 g of 2-(methyl(phenyl)amino)ethan-1-ol were put in a 100 mL 3-necked round bottom flask, and 40 mL of n-BuOH and 20 mL of toluene were added thereto. The mixture was heated and refluxed at 120° C. for 5 hours. Then, a Dean-Stark trap set was used to remove water generated during the reaction from the reactant, and the reactant kept being reacted. When the reaction was complete, the reactant was cooled down, producing crystals. The crystals were filtered, several times washed with hexane, and once recrystallized, obtaining a desired compound.

Step 2: Synthesis of Compound Represented by Chemical Formula 4

120 mg (60%) of NaH was put in a 100 mL 3-necked round bottom flask and agitated in 30 mL of THF. Next, 460 mg of 1,2-dibromopropane was added thereto, and the mixture was cooled down to 0° C. Then, 1 g of the 2,4-bis(4-((2-hydroxyethyl)(methyl)amino)phenyl)cyclobuta-1,3-dien-1,3-diol prepared in the Step 1 dissolved in 10 mL of THF. The solution was slowly added thereto in a dropwise fashion. The resulting mixture was reacted at 70° C. for 5 hours, extracted with methylene chloride (MC), purified through a column chromatography, and additionally purified through a preparative gel permeation chromatography (GPC) to increase purity, obtaining a dye represented by the following Chemical Formula 4.

[Chemical Formula 4]

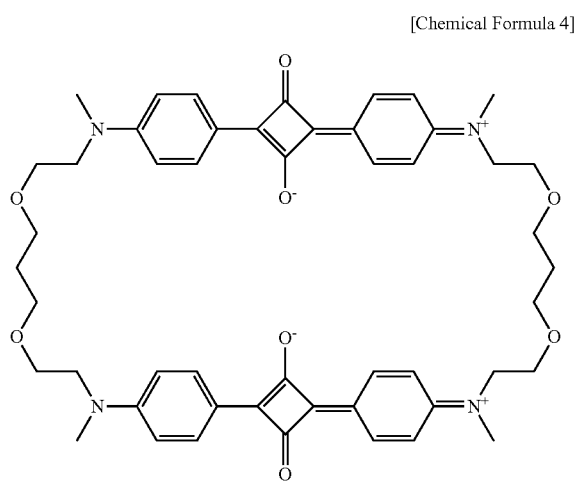 [SMILES: CN1CCOCCCOCCN(C)c2ccc(cc2)C2=C([O-])C(=c3ccc(cc3)=[N+](C)CCOCCCOCC[N+](C)=c3ccc(cc3)=C3C(=O)C(=C3[O-])c3ccc1cc3)C2=O]

Synthesis Example 2

Synthesis of Compound Represented by Chemical Formula 5

Step 1: Synthesis of 2,4-bis(2-acetamino-4-((2-hydroxyethyl)(methyl)amino)phenyl)cyclobuta-1,3-dien-1,3-diol 342 mg of squaric acid) and 2 g of 2-(methyl(3-acetaminophenyl)amino)ethan-1-ol were put in a 100 mL 3-neck rounded bottom flask, and 40 mL of n-BuOH and 20 mL of toluene were added thereto. The mixture was heated and refluxed at 120° C. for 10 hours. Then, a Dean-Stark trap set was used to remove water generated from the reactant during the reaction, and the reactant kept being reacted. When the reaction was complete, the reactant was cooled down, producing crystals. The crystals were filtered, several times cleaned with hexane, and once more recrystallized, obtaining a desired compound.

Step 2: Synthesis of Compound Represented by Chemical Formula 5

120 mg (60%) of NaH was put in a 100 mL 3-necked round bottom flask and agitated in 30 mL of THF. Next, 380 mg of 1,2-dibromopropane was added thereto, and the reactant was cooled down to 0° C. Then, 1.05 g of the 2,4-bis(2-acetamino-4-((2-hydroxyethyl)(methyl)amino)phenyl)cyclobuta-1,3-dien-1,3-diol was dissolved in 10 mL of THF, and the solution was slowly added to the reactant in a dropwise fashion. When the reactant was reacted at 70° C. for 5 hours, the reactant was extracted with methylene chloride (MC) and purified through a column chromatography and an additional preparative gel permeation chromatography (GPC), obtaining a dye represented by the following Chemical Formula 5.

[Chemical Formula 5]

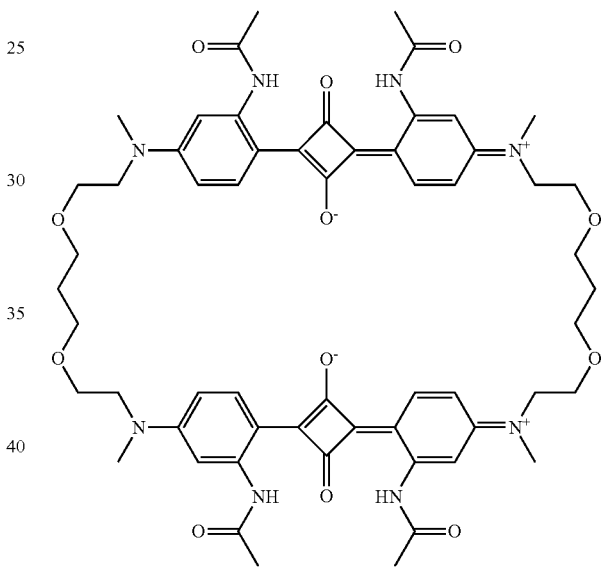

Synthesis Example 3

Synthesis of Compound Represented by Chemical Formula 6

Step 1: Synthesis of 2,4-bis(2-n-butoxy-4-((2-hydroxyethyl)(methyl)amino)phenyl)cyclobuta-1,3-dien-1,3-diol 342 mg of squaric acid and 2.14 g of 2-(methyl(3-butoxyphenyl)amino)ethan-1-ol was put in a 100 mL 3-necked round bottom flask, and 40 mL of n-BuOH and 20 mL of toluene were added thereto. The mixture was heated and refluxed at 120° C. for 7 hour. Then, a Dean-Stark trap set was used to remove water generated from the reactant during the reaction and kept being reacted. When the reaction was complete, the reactant was cooled down, producing crystals. The crystals was filtered, several times washed with hexanes, and once more recrystallized, obtaining a desired compound.

Step 2: Synthesis of Compound Represented by Chemical Formula 6

120 mg (60%) of NaH was put in a 100 mL 3-necked round bottom flask and agitated in 30 mL of THF. Next, 380 mg of 1,2-dibromopropane was added to the agitated product. The mixture was cooled down to 0° C., and a solution prepared by dissolving 1.11 g of the 2,4-bis(2-n-butoxy-4-((2-hydroxyethyl)(methyl)amino)phenyl)cyclobuta-1,3-dien-1,3-diol in 10 mL of THF was slowly added thereto in a dropwise fashion. The resulting mixture was reacted at 70° C. for 5 hours, extracted with methylene chloride (MC), and purified through a column chromatography and an additional preparative gel permeation chromatography (GPC), obtaining a dye represented by following Chemical Formula 6.

[Chemical Formula 6]

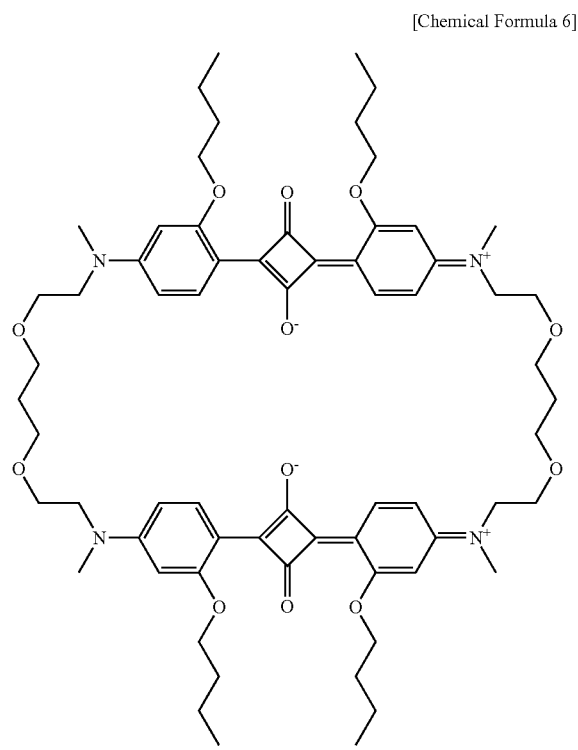 [SMILES: CCCCOc1cc2ccc1C1=C([O-])/C(=c3\cc/c(cc3OCCCC)=[N+](/C)CCOCCCOCC/[N+](C)=c3\cc/c(c(OCCCC)c3)=C3/C(=O)C(=C3[O-])c3ccc(cc3OCCCC)N(C)CCOCCCOCCN2C)C1=O]

Synthesis Example 4

Synthesis of Compound Represented by Chemical Formula 7

Step 1: Synthesis of 2,4-bis(2-acryloxy-4-((2-hydroxyethyl)(methyl)amino)phenyl)cyclobuta-1,3-dien-1,3-diol 342 mg of squaric acid and 2.12 g of 2-(methyl(3-acryloxyphenyl)amino)ethan-1-ol were put in a 100 mL 3-necked round bottom flask, and 40 mL of n-BuOH and 20 mL of toluene were added thereto. The mixture was heated and refluxed at 120° C. for 7 hours. Next, a Dean-Stark trap set was used to remove water generated during the reaction, and the reactant kept being reacted. When the reaction was complete, the reactant was cooled down, producing crystals. The crystals were filtered, several times cleaned with hexane, and once more recrystallized, obtaining a desired compound.

Step 2: Synthesis of Compound Represented by Chemical Formula 7

120 mg (60%) of NaH was put in a 100 mL 3-necked round bottom flask and agitated in 30 mL of THF. Next, 380 mg of 1,2-dibromopropane was added to the agitated product. The mixture was cooled down to 0° C., and a solution prepared by dissolving 1.1 g of the 2,4-bis(2-acryloxy-4-((2-hydroxyethyl)(methyl)amino)phenyl)cyclobuta-1,3-dien-1,3-diol in 10 mL of THF was slowly added thereto in a dropwise fashion. The resulting mixture was reacted at 70° C. for 5 hours. When the reaction was complete, the reactant was extracted with methylene chloride (MC) and purified through a column chromatography and an additional preparative gel permeation chromatography (GPC) to increase purity, obtaining a dye represented by the following Chemical Formula 7.

[Chemical Formula 7]

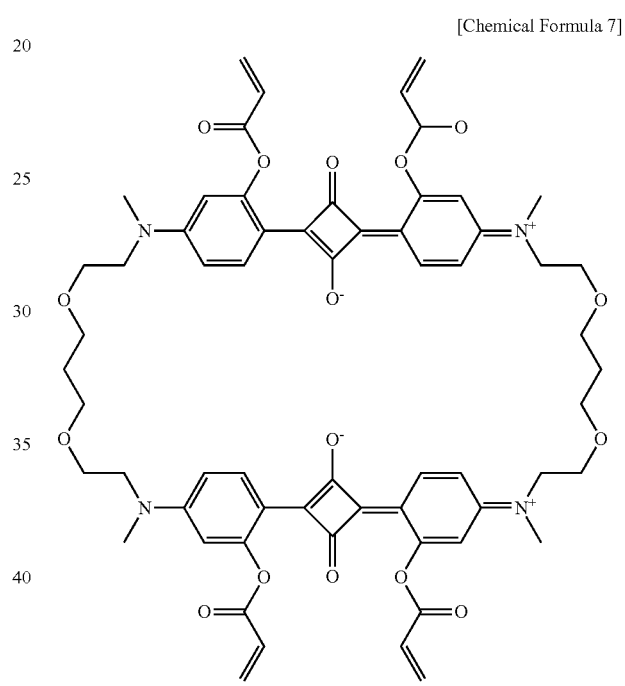

Synthesis Example 5

Synthesis of Compound Represented by Chemical Formula 8

Step 1: Synthesis of 2,4-bis(2-acryloxy-4-((2-hydroxyethyl)(methyl)amino)phenyl)cyclobuta-1,3-dien-1,3-diol 342 mg of squaric acid and 2.12 g of 2-(methyl(3-acryloxyphenyl)amino)ethan-1-ol were put in a 100 mL 3-necked round bottom flask, and 40 mL of n-BuOH and 20 mL of toluene were added thereto. The mixture was heated and refluxed at 120° C. for 7 hours. Next, a Dean-Stark trap set was used to remove water generated during the reaction and kept being reacted. When the reaction was complete, the reactant was cooled down, producing crystals. The crystals were filtered, several times cleaned with hexane, and once more recrystallized, obtaining a desired compound.

Step 2: Synthesis of Compound Represented by Chemical Formula 8

120 mg (60%) of NaH was put in a 100 mL 3-necked round bottom flask and agitated in 30 mL of THF. Next, 530 mg of 1,3-bis(bromomethyl)benzene was added to the reactant. The mixture was cooled down to 0° C., and a solution prepared by dissolving 1.1 g of the 2,4-bis(2-acryloxy-4-((2-hydroxyethyl)(methyl)amino)phenyl)cyclobuta-1,3-dien-1,3-diol in 10 mL of THF was slowly added thereto in a dropwise fashion. The resulting mixture was reacted at 70° C. for 5 hours. When the reaction was complete, the reactant was extracted with methylene chloride (MC) and purified through a column chromatography and an additional preparative gel permeation chromatography (GPC), obtaining a dye represented by the following Chemical Formula 8.

was used to remove water generated during the reaction, and the reactant kept being reacted. When the reaction was complete, the reactant was cooled down, producing crystals. The crystals were filtered, several times cleaned with hexane, and once more recrystallized, obtaining a desired compound.

Step 2: Synthesis of Compound Represented by Chemical Formula 9

120 mg (60%) of NaH was put in a 100 mL 3-necked round bottom flask and agitated in 30 mL of THF. Next, 530 mg of

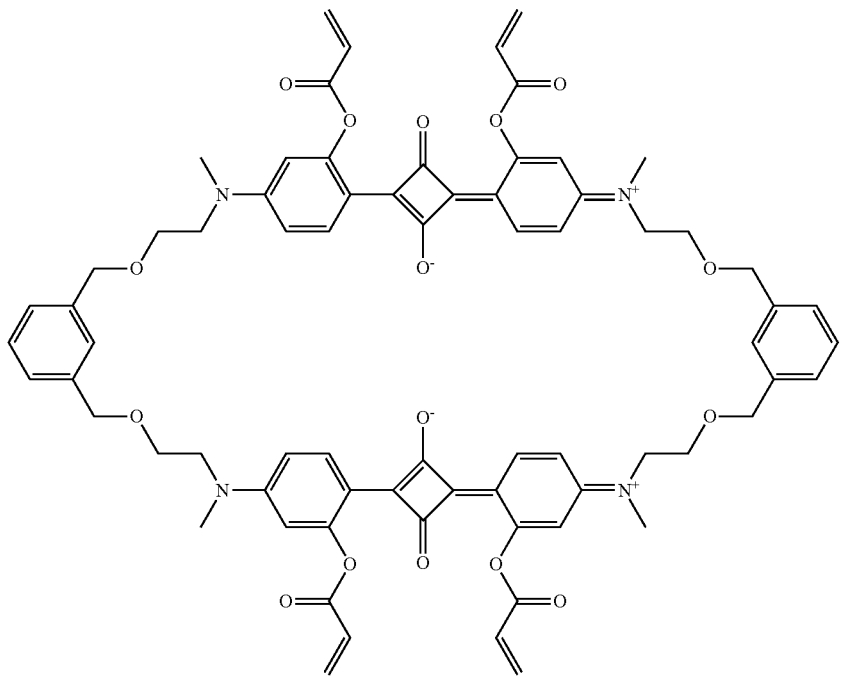

[Chemical Formula 8]

Synthesis Example 6

Synthesis of Compound Represented by Chemical Formula 9

Step 1: Synthesis of 2,4-bis(2-acetamino-4-((2-hydroxyethyl)(methyl)amino)phenyl)cyclobuta-1,3-dien-1,3-diol 342 mg of squaric acid and 2 g of 2-(methyl(3-acetaminophenyl)amino)ethan-1-ol were put in a 100 mL 3-neck rounded bottom flask, and 40 mL of n-BuOH and 20 mL of toluene were added thereto. The mixture was heated and refluxed at 120° C. for 10 hours. Next, a Dean-Stark trap set 1,4-bis(bromomethyl)benzene was added to the agitated product. The mixture was cooled down to 0° C., and a solution prepared by dissolving 1.1 g of the 2,4-bis(2-acetamino-4-((2-hydroxyethyl)(methyl)amino)phenyl)cyclobuta-1,3-dien-1,3-diol in 10 mL of THF was slowly added thereto in a dropwise fashion. The resulting mixture was reacted at 70° C. for 5 hours, extracted with methylene chloride (MC), and purified through a column chromatography and additional preparative gel permeation chromatography (GPC) to increase purity, obtaining a dye represented by the following Chemical Formula 9.

[Chemical Formula 9]

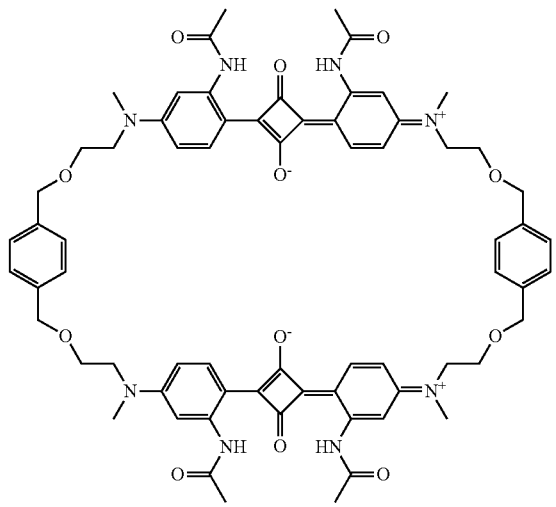

Example 1

A photosensitive resin composition was prepared by mixing the components provided in the following Table 1 in an amount given therein.

TABLE 1

| Materials | | Amount (wt %) |
|---|---|---|
| Dye | Compound prepared in Synthesis Example 1 | 2.0 |
| Pigment dispersion | Y138 | 15.0 |
| Alkali soluble resin | (A)/(B) = 15/85(w/w), molecular weight (Mw) = 22,000 (A): methacrylic acid (B): benzylmethacrylate | 3.5 |
| Photopolymerization monomer | dipentaerythritolhexaacrylate(DPHA) | 8.0 |
| Photopolymerization initiator | 1,2-octandione | 1.0 |
| | 2-dimethylamino-2-(4-methyl-benzyl)-1-(4-morpholin-4-yl-phenyl)-butan-1-one | 0.5 |
| Solvent | Cyclohexanone | 40.0 |
| | propylene glycol methylether acetate (PGMEA) | 30.0 |

Example 2

A photosensitive resin composition was prepared according to the same method as Example 1 except for using the compound according to Synthesis Example 2 instead of the compound according to Synthesis Example 1.

Example 3

A photosensitive resin composition was prepared according to the same method as Example 1 except for using the compound according to Synthesis Example 3 instead of the compound according to Synthesis Example 1 as a dye.

Example 4

A photosensitive resin composition was prepared according to the same method as Example 1 except for using the compound according to Synthesis Example 4 instead of the compound according to Synthesis Example 1 as a dye.

Example 5

A photosensitive resin composition was prepared according to the same method as Example 1 except for using the compound according to Synthesis Example 5 instead of the compound according to Synthesis Example 1 as a dye.

Example 6

A photosensitive resin composition was prepared according to the same method as Example 1 except for using the compound according to Synthesis Example 6 instead of the compound according to Synthesis Example 1 as a dye.

Comparative Example 1

A photosensitive resin composition was prepared by mixing the component provided in the following Table 2 in an amount given therein.

TABLE 2

| Materials | | Amount (wt %) |
|---|---|---|
| Pigment dispersion | C.I.Pigmnet Green 58 | 20.0 |
| | C.I.Pigment Yellow 138 | 15.0 |
| Alkali soluble resin | (A)/(B) = 15/85 (w/w), molecular weight (Mw) = 22,000 (A): methacrylic acid (B): benzylmethacrylate | 2.5 |
| Photopolymerization monomer | Dipentaerythritolhexaacrylate (DPHA) | 5.0 |
| Photopolymerization initiator | 1,2-octandione | 1.0 |
| | 2-dimethylamino-2-(4-methyl-benzyl)-1-(4-morpholin-4-yl-phenyl)-butan-1-one | 0.5 |
| Solvent | cyclohexanone | 40.0 |
| | propylene glycol methylether acetate (PGMEA) | 16.0 |

Comparative Example 2

A resin composition was prepared according to the same method as Comparative Example 1 except for using C.I. Pigment Green 36 instead of C.I. Pigment Green 58 as a green pigment.

Property Evaluation

Each photosensitive resin composition according to Examples 1 to 6 and Comparative Examples 1 and 2 was coated to be 1 to 3 μm thick on a 1 mm-thick of degreased glass substrate, and dried on a 90° C. plate for 2 minutes, forming a film. The film strip was exposed to a light using a high-pressured mercury lamp with a main wavelength of 365 nm and dried in a 200° C. mechanical circulation drier for 5 minutes to form a pixel layer.

The pixel layer was measured regarding color coordinate (x, y) and luminance Y using a spectrophotometer (MCPD3000, Otsuka electronics Co., Ltd.). In addition, the pixel layer was calculated regarding contrast ratio according to the following equation 1 after measuring the amount of the light when a polarizer was open and closed using a contrast tester (CT-1, Tsubosaka Electric Co., Ltd.). The results are provided in the following Table 4.

$$\text{Contrast ratio} = L_{Open}/L_{Close} \quad \text{[Equation 1]}$$

TABLE 3

|  | x | y | Y | Contrast ratio |
|---|---|---|---|---|
| Example 1 | 0.284 | 0.575 | 63.9 | 15,100 |
| Example 2 | 0.285 | 0.574 | 64.3 | 14,700 |
| Example 3 | 0.290 | 0.561 | 66.2 | 14,800 |
| Example 4 | 0.292 | 0.576 | 64.2 | 15,300 |
| Example 5 | 0.286 | 0.553 | 65.7 | 15,800 |
| Example 6 | 0.297 | 0.567 | 65.4 | 13,600 |
| Comparative Example 1 | 0.283 | 0.581 | 59.0 | 13,300 |
| Comparative Example 2 | 0.271 | 0.583 | 57.5 | 13,600 |

As shown in Table 3, the pixel layers formed using the photosensitive compositions according to Examples 1 to 6 had excellent luminance and contrast ratio compared with the pixel layers formed using the photosensitive compositions according to Comparative Examples 1 and 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A photosensitive resin composition for a color filter, comprising:
(A) a dye represented by the following Chemical Formula 1;
(B) an alkali soluble resin;
(C) a photopolymerizable monomer;
(D) a photopolymerization initiator; and
(E) a solvent:

[Chemical Formula 1]

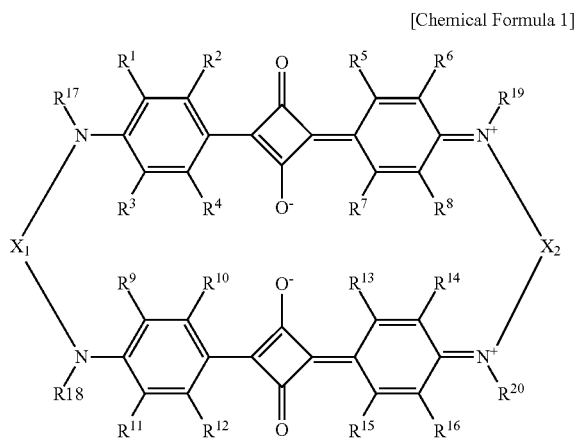

wherein, in Chemical Formula 1,
$R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, and
$X_1$ and $X_2$ are each independently a linking group selected from —O—, —NH—, —S—, a substituted or unsubstituted C1 to C30 alkylene group, a substituted or unsubstituted C6 to C30 arylene group, a substituted or unsubstituted C3 to C30 heteroarylene group, and a combination thereof.

2. The photosensitive resin composition for a color filter of claim 1, wherein the dye (A) is represented by the following Chemical Formula 2:

[Chemical Formula 2]

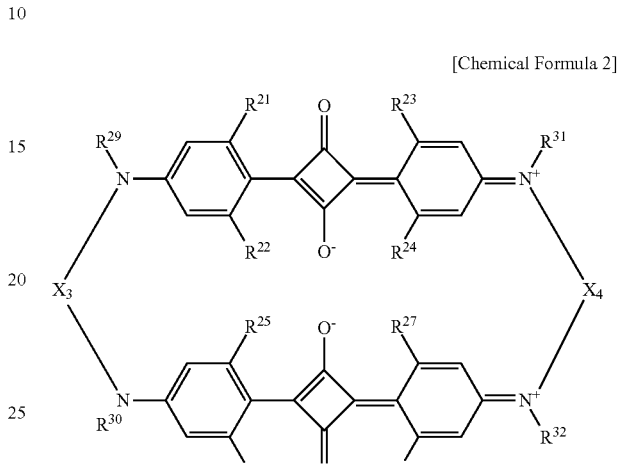

wherein, in Chemical Formula 2,
$R^{21}$ to $R^{28}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group,
$R^{29}$ to $R^{32}$ are each independently, hydrogen, a substituted or unsubstituted C1 to C30 alkyl group, a substituted or unsubstituted C6 to C30 aryl group, or a substituted or unsubstituted C3 to C30 heteroaryl group, and
$X_3$ and $X_4$ are a linking group represented by the following Chemical Formula 3, and are the same or different from each other,

[Chemical Formula 3]

wherein, in Chemical Formula 3,
n and m are an integer ranging from 0 to 5, and
A is a substituted or unsubstituted C1 to C30 alkylene group, a substituted or unsubstituted C6 to C30 arylene group, or a combination thereof.

3. The photosensitive resin composition for a color filter of claim 1, wherein the dye (A) comprises at least one compounds represented by the following Chemical Formulae 4 to 9:

[Chemical Formula 4]
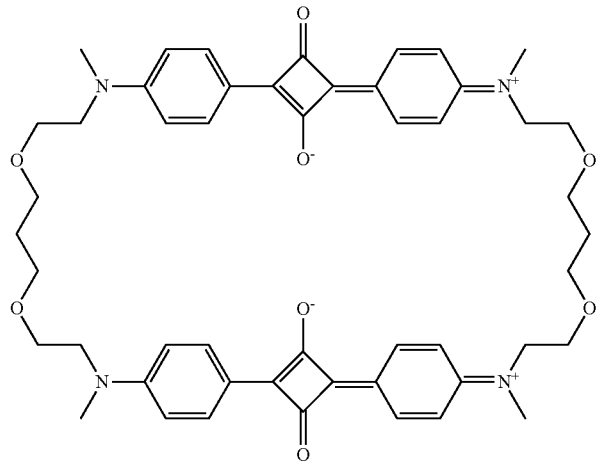
[Chemical Formula 5]
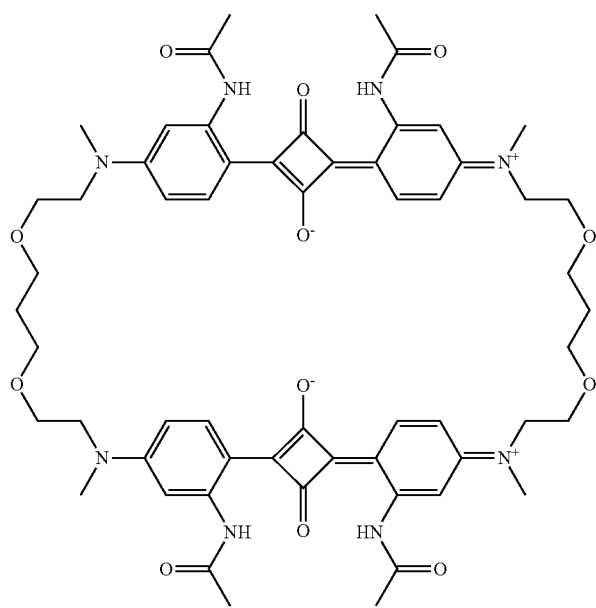

[Chemical Formula 6]
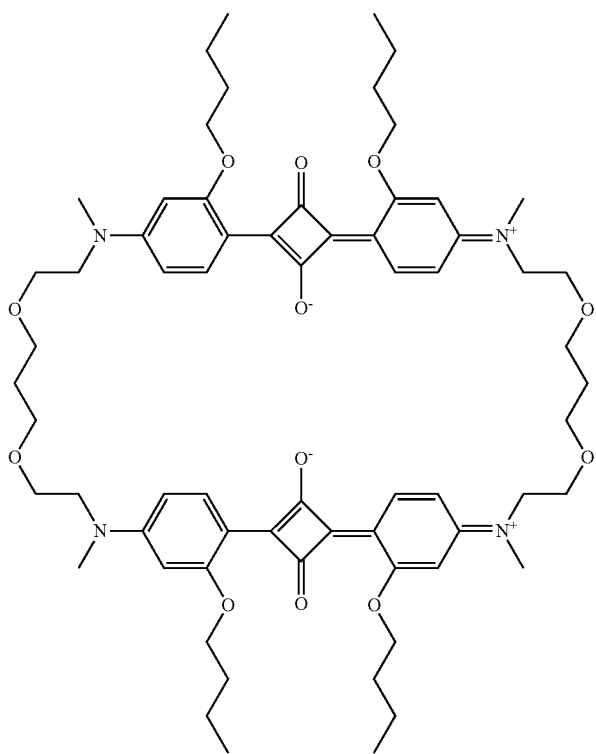
[Chemical Formula 7]
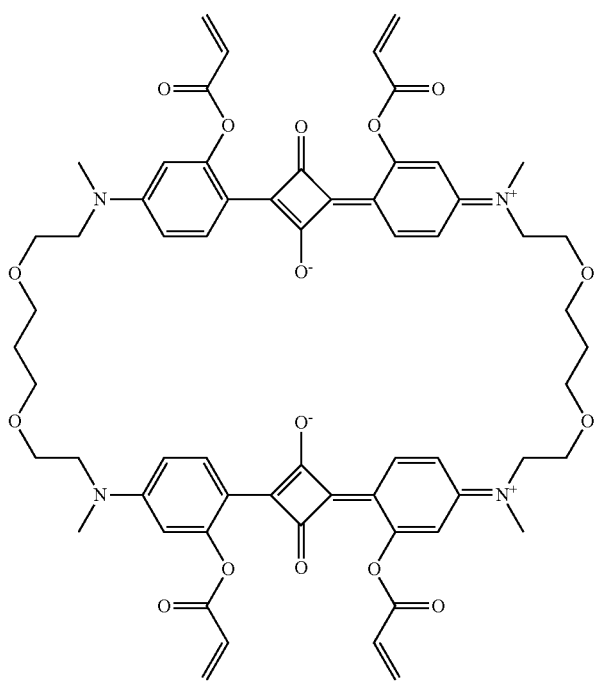

-continued

[Chemical Formula 8]

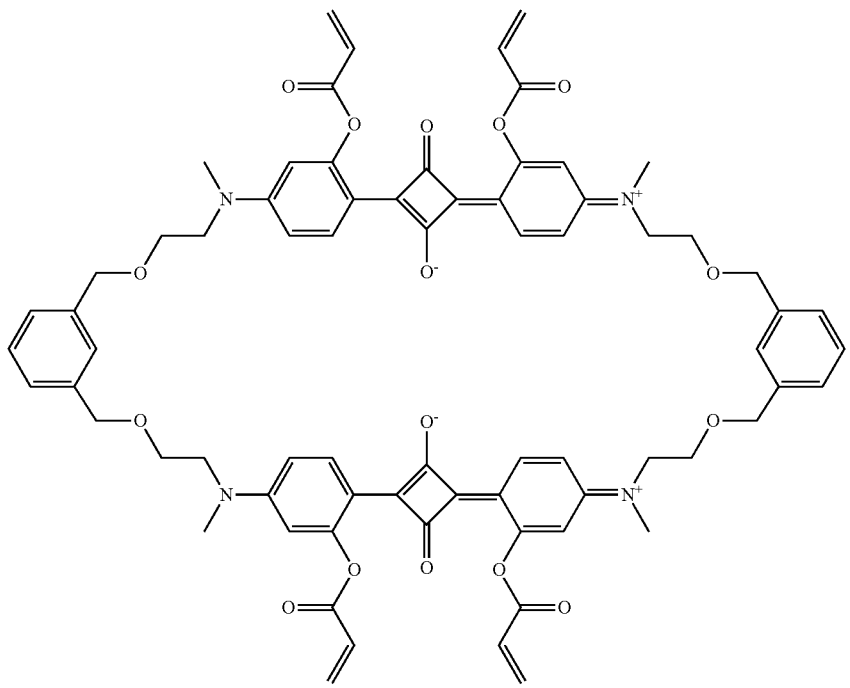

[Chemical Formula 9]

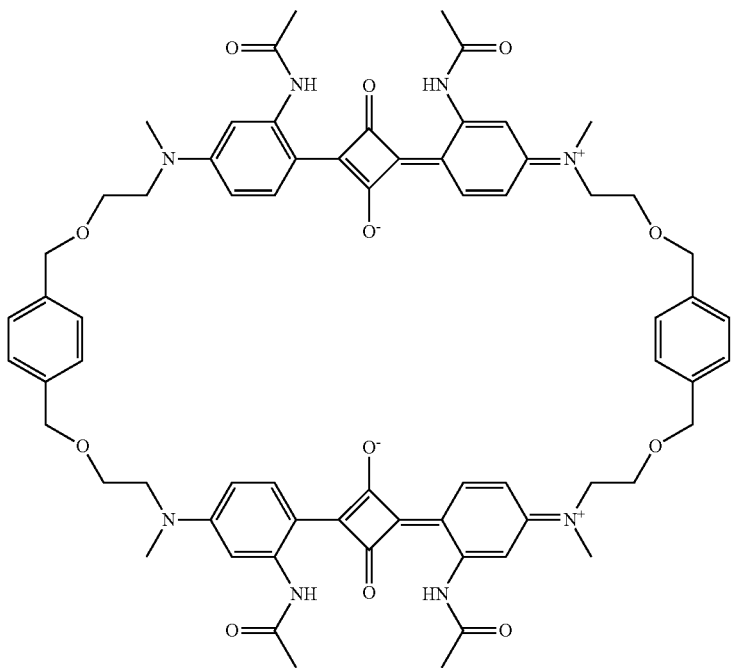

4. The photosensitive resin composition for a color filter of claim 1, wherein the dye (A) has a molecular weight of 500 to 5,000.

5. The photosensitive resin composition for a color filter of claim 1, wherein the dye (A) is present in an amount of 0.1 to 20 wt %.

6. The photosensitive resin composition for a color filter of claim 1, wherein the photosensitive resin composition for a color filter further comprises a pigment.

7. The photosensitive resin composition for a color filter of claim 6, wherein the dye (A) and pigment are present at a weight ratio of 99:1 to 1:99.

8. A color filter manufactured using the photosensitive resin composition according to claim 1.

9. A dye represented by the following Chemical Formula 1:

[Chemical Formula 1]

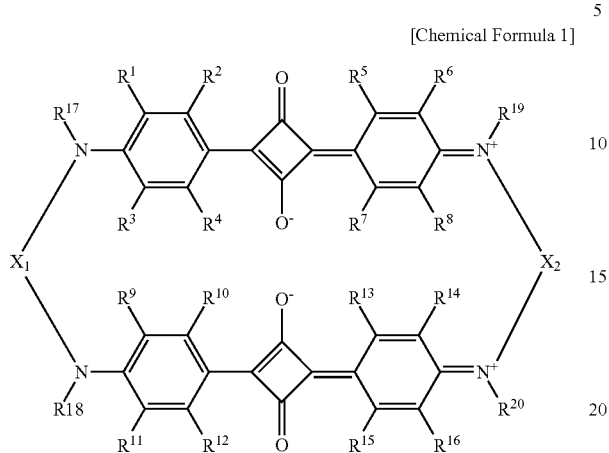

wherein, in Chemical Formula 1, $R^1$ to $R^{20}$ are each independently, hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C6 to C30 aryloxy group, a substituted or unsubstituted C3 to C30 heteroaryl group, a substituted or unsubstituted C3 to C30 heteroaryloxy group, a substituted or unsubstituted amide group, or a substituted or unsubstituted (meth)acrylate group, and $X_1$ and $X_2$ are each independently a linking group selected from —O—, —NH—, —S—, a substituted or unsubstituted C1 to C30 alkylene group, a substituted or unsubstituted C6 to C30 arylene group, a substituted or unsubstituted C3 to C30 heteroarylene group, and a combination thereof.

* * * * *